United States Patent
Cho et al.

(10) Patent No.: US 12,225,823 B2
(45) Date of Patent: Feb. 11, 2025

(54) METHOD OF FABRICATING PIEZOELECTRIC COMPOSITE

(71) Applicant: NEUROSONA Co., Ltd., Seoul (KR)

(72) Inventors: Nam Kuy Cho, Yongin-si (KR); Jin Su Kim, Yongin-si (KR); Jung Ho Ko, Seoul (KR); Man Soon Yoon, Cheongju-si (KR); Young Min Park, Cheongju-si (KR)

(73) Assignee: NEUROSONA Co., Ltd., Seoul (KR)

( * ) Notice: Subject to any disclaimer, the term of this patent is extended or adjusted under 35 U.S.C. 154(b) by 459 days.

(21) Appl. No.: 17/529,272

(22) Filed: Nov. 18, 2021

(65) Prior Publication Data

US 2022/0158081 A1 May 19, 2022

(30) Foreign Application Priority Data

Nov. 18, 2020 (KR) .................. 10-2020-0154993

(51) Int. Cl.
  *H10N 30/092* (2023.01)
  *H10N 30/85* (2023.01)
(52) U.S. Cl.
  CPC ......... *H10N 30/092* (2023.02); *H10N 30/852* (2023.02)
(58) Field of Classification Search
  CPC .... H10N 30/092; H10N 30/852; H10N 30/05; H10N 30/097; H10N 30/503; Y10T 29/42; Y10T 29/49005; Y10T 29/49144
  See application file for complete search history.

(56) References Cited

U.S. PATENT DOCUMENTS

| | | | | |
|---|---|---|---|---|
| 4,412,148 A | * | 10/1983 | Klicker | H10N 30/852 |
| | | | | 310/357 |
| 5,670,009 A | * | 9/1997 | Tarn | H05K 13/046 |
| | | | | 29/834 |

FOREIGN PATENT DOCUMENTS

| | | |
|---|---|---|
| JP | H11-276480 A | 10/1999 |
| JP | 2020-137125 A | 8/2020 |
| JP | 7050803 B | 4/2022 |
| KR | 10-2006-0100870 A | 9/2006 |
| KR | 10-1648344 B1 | 8/2016 |
| WO | 2020/101425 A1 | 5/2020 |

OTHER PUBLICATIONS

Notice of Allowance mailed Dec. 16, 2022 for Korean Application No. 10-2020-0154993.
European Search Report mailed Apr. 11, 2022 for European Application No. 21208746.4.

* cited by examiner

*Primary Examiner* — Donghai D Nguyen
(74) *Attorney, Agent, or Firm* — Insight Law Group, PLLC; Seung Lee

(57) ABSTRACT

A technology of fabricating a piezoelectric composite applicable to an ultrasonic transducer is disclosed. According to one aspect of the present disclosure, a support member formed with a plurality of through holes is located on one surface of an electrode plate, and lower surfaces of piezoelectric pillars having shapes respectively corresponding to the through holes are adhered onto the one surface of the electrode plate to form the piezoelectric pillars. Further, according to an additional aspect, the plurality of piezoelectric pillars having shapes corresponding to the through holes of the support member are formed by sintering a piezoelectric pellet molded in a pillar shape.

6 Claims, 5 Drawing Sheets

METHOD OF FABRICATING PIEZOELECTRIC COMPOSITE

CROSS-REFERENCE TO RELATED APPLICATION(S)

This application claims priority from Korean Patent Application No. 10-2020-0154993, filed on Nov. 18, 2020, in the Korean Intellectual Property Office, the disclosure of which is incorporated herein by reference in its entirety.

BACKGROUND

1. Field

A technology of fabricating a piezoelectric composite applicable to an ultrasonic transducer is disclosed.

2. Description of Related Art

A piezoelectric composite is used to secure low acoustic impedance while maintaining an excellent piezoelectric characteristic. As is known, the piezoelectric composite is fabricated by filling a polymer or the like having low acoustic impedance around a piezoelectric element, for example, a lead zirconate titanate (PZT) element.

According to a coupled structure of the piezoelectric element and the polymer, the piezoelectric composite can be divided into ten types, such as a 1-3 mode, a 2-2 mode, a 3-3 mode, and the like, and a first number indicates a form of the piezoelectric element, and the following number indicates a form of the polymer. For example, the 1-3 mode piezoelectric composite may have a form in which a linear piezoelectric fiber of 1 is planted in a polymer matrix of 3.

Meanwhile, conventionally, a piezoelectric composite was fabricated using a powder injection-molding fabrication method. As is well known, the powder injection-molding fabrication method is a method of mass production by filling a powder material in a cavity of a fabricated mold. In the case of fabricating an injection-molded body for the piezoelectric composite (preform), an injection-molded body for a three-dimensional shaped piezoelectric composite can be enlarged and mass produced.

However, fabricating the injection-molded body of a three-dimensional shaped piezoelectric composite having piezoelectric pillars having a small cross-sectional area is difficult and incurs large costs. Further, even when the injection-molded body is fabricated, a problem in that the injection-molded body for the piezoelectric composite which is generated during a degreasing operation of removing an organic binder from the injection-molded body or during a sintering operation of sintering the degreasing body, from which the organic binder is removed, at a high temperature is distorted or collapses occurs.

In addition, a heating temperature in the degreasing operation for the injection-molded body of the piezoelectric composite is approximately 600° C., and a heating temperature in the sintering operation is approximately 900° C. to 1100° C. Accordingly, when the piezoelectric composite is fabricated using the conventional powder injection-molding fabrication method, a relatively high temperature is required, and accordingly, fabrication costs relatively increase.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description is directed to providing a method of fabricating a piezoelectric composite capable of reducing costs and an ultrasonic transducer including the same.

Further, the following description is directed to providing a method of easily and simply fabricating a piezoelectric composite using a simple method instead of a conventional powder injection-molding fabrication method and an ultrasonic transducer including the same.

In addition, the following description is directed to providing a method of fabricating a piezoelectric composite using a relatively low temperature and an ultrasonic transducer including the same.

According to one aspect of the present disclosure, a support member formed with a plurality of through holes is located on one surface of an electrode plate, and lower surfaces of piezoelectric pillars having shapes respectively corresponding to the through holes are adhered onto the one surface of the electrode plate to form the piezoelectric pillars.

Further, according to an additional aspect, the plurality of piezoelectric pillars having shapes corresponding to the through holes of the support member may be formed by sintering a piezoelectric pellet molded in a pillar shape.

In addition, according to an additional aspect, a conductive adhesive layer may be formed on an upper surface of the electrode plate, and the conductive adhesive layer may be formed in a plurality of piezoelectric pillar adhesive regions corresponding to the plurality of through holes of the support member.

In addition, according to an additional aspect, the piezoelectric pillars are inserted into the through holes of the support member, and lower surfaces of the plurality of piezoelectric pillars are adhered to the one surface of the electrode plate by applying a load to upper surfaces of the plurality of piezoelectric pillars, so that the piezoelectric pillars may be formed to be adhered to the one surface of the electrode plate.

In addition, according to an additional aspect, when the lower surfaces of the plurality of piezoelectric pillars are adhered to the one surface of the electrode plate, the load may be applied to the upper surfaces of the plurality of piezoelectric pillars, and the plurality of piezoelectric pillars may be additionally heated for 30 to 90 minutes at a temperature of 100° C. to 130° C.

In addition, according to an additional aspect, the support member may be removed and the upper surfaces of the plurality of piezoelectric pillars may be adhered to one surface of a second electrode plate.

Other features and aspects will be apparent from the following detailed description, the drawings, and the claims.

Figure 1:
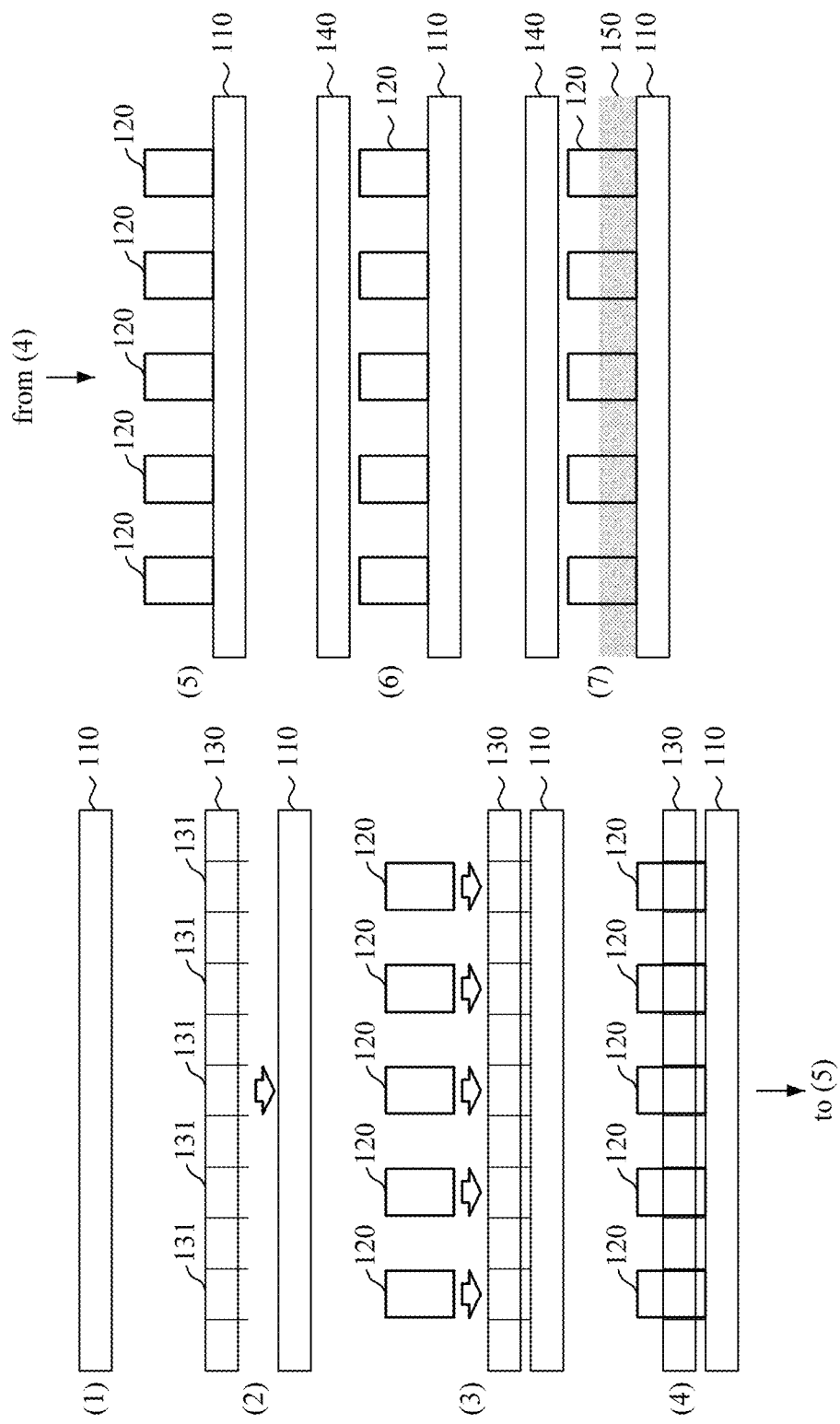
FIG. 1 is a flow chart illustrating a method of fabricating a piezoelectric composite according to one embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The above-described and additional aspects are specified through embodiments described with reference to the accompanying drawings. It is understood that the components of each embodiment may be variously combined within the embodiment without other mentions or contradiction with each other.

Figure 3:
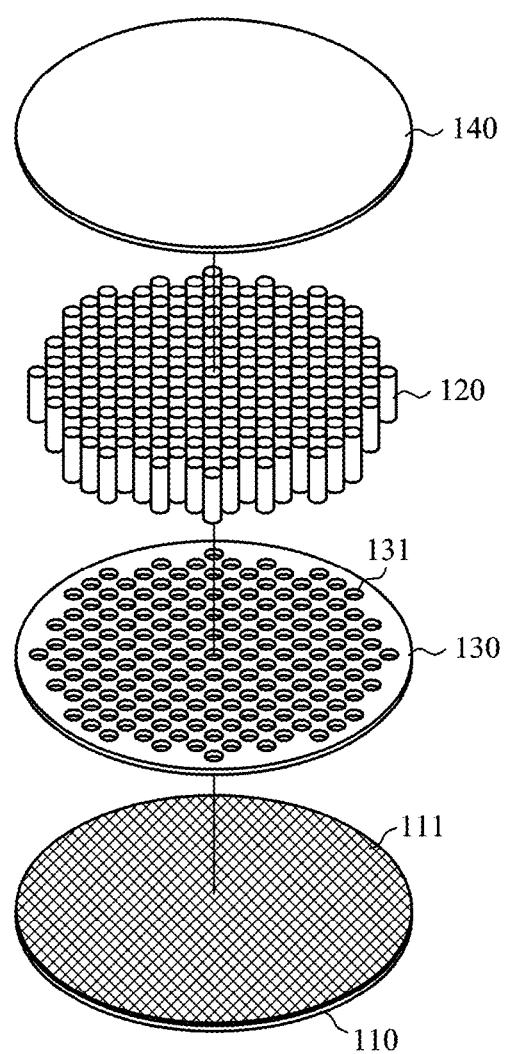
FIG. 3 is an exploded perspective view for describing the method of fabricating a piezoelectric composite according to one embodiment.
Figure 4:
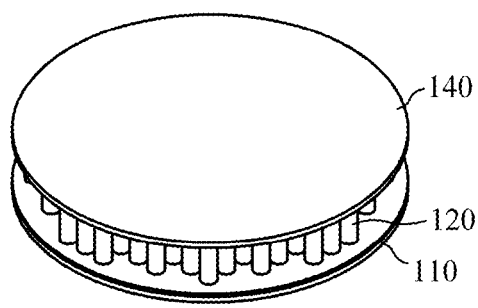
FIG. 4 is a perspective view illustrating a state in which upper surfaces and lower surfaces of a plurality of piezoelectric pillars according to one embodiment are adhered to an electrode plate.

FIG. 1 is a flow chart illustrating a method of fabricating a piezoelectric composite according to one embodiment, FIG. 3 is an exploded perspective view for describing the method of fabricating a piezoelectric composite according to one embodiment, and FIG. 4 is a perspective view illustrating a state in which upper surfaces and lower surfaces of a plurality of piezoelectric pillars according to one embodiment are adhered to an electrode plate. Hereinafter, the present disclosure will be described with reference to the drawings.

As shown in FIG. 1, the method of fabricating a piezoelectric composite according to an aspect of the present disclosure includes an electrode plate preparing operation of preparing a first electrode plate 110 (see (1)), a support member arranging operation of locating a support member 130 formed with a plurality of through holes 131 on one surface of the first electrode plate 110 (see (2) and (3)), and a piezoelectric pillar forming operation of forming and adhering lower surfaces of piezoelectric pillars 120 having shapes respectively corresponding to the through holes 131 on one surface of the first electrode plate 110 (see (3) and (4)).

The first electrode plate 110 in the electrode plate preparing operation (see (1)) may be a metal plate, or an aluminum plate in the embodiment. Further, the first electrode plate 110 may have a circular shape or a quadrangular shape. In the embodiment of FIGS. 3 and 4, a circular electrode plate is used as the first electrode plate 110.

In the support member arranging operation (see (2) and (3)), the support member 130 formed with the plurality of through holes 131 is located on one surface of the first electrode plate 110. The plurality of through holes 131 are formed in the support member 130 as shown in FIG. 3. The support member 130 may have a plate shape having a thickness, and may be made of a silicon material. The support member 130 may have a circular shape or a quadrangular shape. In the embodiment of FIGS. 3 and 4, a circular flat plate is used as the support member 130. In the embodiment, the support member 130 may have a spherical plate shape with a convex center rather than the circular flat plate shape.

In the piezoelectric pillar forming operation (see (3) and (4)), the lower surfaces of the piezoelectric pillars 120 having shapes respectively corresponding to the through holes 131 are formed to be adhered onto one surface of the first electrode plate 110. The piezoelectric pillar 120 includes a piezoelectric material which generates a piezoelectric phenomenon. In the embodiment, the piezoelectric material may include a lead zirconate titanate (PZT) piezoelectric ceramic.

The plurality of piezoelectric pillars 120 have shapes respectively corresponding to the plurality of through holes 131. For example, the plurality of piezoelectric pillars 120 are respectively located at positions corresponding to the plurality of through holes 131. Further, for example, when the through hole 131 has a cylindrical shape, the piezoelectric pillar 120 also has a cylindrical shape, and when the through hole 131 has a quadrangular pillar shape, the piezoelectric pillar 120 also has a quadrangular pillar shape. In the embodiment of FIGS. 3 and 4, the piezoelectric pillar has a cylindrical shape.

When the support member 130 is arranged on one surface of the first electrode plate 110, portions corresponding to the through holes 131 on one surface of the first electrode plate 110 are upwardly exposed by the plurality of through holes 131 formed in the support member 130. The lower surfaces of the piezoelectric pillars 120 are adhered to corresponding regions of one surface of the first electrode plate 110 exposed by the through holes 131. In this case, since the shapes of the plurality of piezoelectric pillars 120 correspond to the plurality of through holes 131 of the support member 130, the support member 130 supports the plurality of piezoelectric pillars 120 formed in the piezoelectric composite.

According to an aspect of the present disclosure, the support member 130 formed with the plurality of through holes 131 is located on one surface of the first electrode plate 110, and the lower surfaces of piezoelectric pillars 120 respectively corresponding to the through holes 131 are adhered onto one surface of the first electrode plate 110 to form the piezoelectric pillars 120.

Accordingly, at least some structures of the piezoelectric composite (a coupled structure of the first electrode plate 110 and the piezoelectric pillars 120) may be easily implemented at low cost, and the plurality of piezoelectric pillars 120 are formed to be easily adhered onto one surface of the first electrode plate 110 using the support member 130.

As shown in FIG. 1, according to an additional aspect of the present disclosure, the piezoelectric pillar forming operation (see (3) and (4)) may include a piezoelectric pillar inserting operation of inserting the piezoelectric pillars 120 into the through holes 131 of the support member 130 (see (3) and (4)), and a piezoelectric pillar lower surface adhering operation of applying a load to the upper surfaces of the plurality of piezoelectric pillars 120 to adhere the lower surfaces of the plurality of piezoelectric pillars 120 to one surface of the first electrode plate 110 (see (3) and (4)).

In the piezoelectric pillar inserting operation (see (3) and (4)), the shapes of the piezoelectric pillars 120 correspond to the plurality of through holes 131 formed in the support member 130. The piezoelectric pillars 120 may be inserted through the plurality of through holes 131. In this case, since the shapes of the piezoelectric pillars 120 correspond to the through holes 131 of the support member 130, the support member 130 supports the piezoelectric pillars 120.

In the piezoelectric pillar lower surface adhering operation (see (3) and (4)), the load may be applied to the upper surfaces of the plurality of piezoelectric pillars 120 to adhere the lower surfaces of the plurality of piezoelectric pillars 120 to one surface of the first electrode plate 110. The load is applied to the upper surfaces of the piezoelectric pillars 120 in a state in which the piezoelectric pillars 120 having shapes corresponding to the plurality of through holes 131 are inserted and supported through the plurality of through holes 131. Accordingly, the lower surfaces of the plurality of piezoelectric pillars 120 may be adhered to one surface of the first electrode plate.

In the embodiment, when the plurality of piezoelectric pillars 120 are inserted into the plurality of through holes 131, the lower surfaces of the plurality of piezoelectric pillars 120 and one surface of the first electrode plate 110 may come into contact with each other. In the embodiment, a conductive adhesive may be applied to the lower surfaces of the plurality of piezoelectric pillars 120 or one surface of the first electrode plate 110. Alternatively, the conductive adhesive may be applied to both the lower surfaces of the plurality of piezoelectric pillars 120 and one surface of the first electrode plate 110.

According to an additional aspect of the present disclosure, since the plurality of piezoelectric pillars 120 are inserted into the plurality of through holes 131 formed in the support member 130 and arranged at corresponding positions of the first electrode plate 110, the plurality of piezoelectric pillars 120 may be easily arranged at corresponding positions of one surface of the first electrode plate 110.

According to an additional aspect of the present disclosure, the plurality of piezoelectric pillars having shapes corresponding to the through holes of the support member may be formed by sintering a piezoelectric pellet molded in a pillar shape.

For example, in order to fabricate the piezoelectric pellet, raw materials of lead zirconate titanate (for example, PbO, $ZrO_2$ and $TiO_2$) and raw materials of impurities (for example, $Nb_2O_5$, $Ta_2O_5$, $Fe_2O_3$, and MnO), and the like are calcined at approximately 800° C. to 1000° C. for 2 hours to be pulverized. Further, a binder (polyvinyl alcohol (PVA)) may be added and the resultant may be molded in a pillar shape to form the piezoelectric pellet. The piezoelectric pellet formed as above are sintered at 1100 to 1200° C. for 2 hours to fabricate the piezoelectric pillars 120. A technology itself for fabricating the piezoelectric pellet and the technology itself for sintering such piezoelectric pellets are well known to those skilled in the art.

Accordingly, it is not necessary to fabricate an injection-molded body for the piezoelectric composite (preform) which is required for powder injection-molding as in the related art. Accordingly, a problem in that the injection-molded body for the piezoelectric composite which is generated during a degreasing operation of removing an organic binder from the injection-molded body or during a sintering operation of sintering the degreasing body, from which the organic binder is removed, at a high temperature is distorted or collapses does not occur.

As shown in FIG. 1, according to an additional aspect of the present disclosure, the method of fabricating a piezoelectric composite may further include an operation of removing the support member 130 (see (5)), and a piezoelectric pillar upper surface adhering operation of adhering the upper surfaces of the plurality of piezoelectric pillars 120 to one surface of a second electrode plate 140 (see (6)).

When the piezoelectric pillars 120 are adhered to one surface of the first electrode plate 110, in the operation of removing the support member 130 (see (5)), the support member 130 which supports the piezoelectric pillars 120 is lifted upward and removed from the first electrode plate 110.

Further, in the piezoelectric pillar upper surface adhering operation (see (6)), the upper surfaces of the plurality of piezoelectric pillars 120 are adhered to one surface of the second electrode plate 140. In the embodiment, a conductive adhesive may be applied to the upper surfaces of the plurality of piezoelectric pillars 120 or one surface of the second electrode plate 140. Alternatively, the conductive adhesive may be applied to both the upper surfaces of the plurality of piezoelectric pillars 120 and one surface of the second electrode plate 140.

In the embodiment, the second electrode plate 140 may be a metal plate or an aluminum plate. Further, the second electrode plate 140 may have a circular shape or a quadrangular shape. In the embodiment of FIGS. 3 and 4, a circular electrode plate is used as the second electrode plate 140.

According to an additional aspect of the present disclosure, since the plurality of piezoelectric pillars 120 are formed to be adhered between one surface of the first electrode plate 110 and one surface of the second electrode plate 140, the piezoelectric composite may be easily implemented at low cost.

As shown in FIG. 1, according to an additional aspect, a polymer filling operation of filling the periphery of the plurality of piezoelectric pillars 120 (see (7)) with a polymer 150 may be further included.

According to the embodiment, a space except for the piezoelectric pillars 120 among a space between the first electrode plate 110 and the second electrode plate 140 may be filled with an air layer, or at least a portion of the remaining space may be filled with the polymer 150. The polymer 150 may be polyepoxy or a polyurethane-based polymer compound. Further, the polymer 150 may be a thermosetting epoxy having a predetermined density.

Since a technique itself for filling the space between the first electrode plate 110 and the second electrode plate 140 with a polymer having low acoustic impedance is well known to those skilled in the art, a detailed description thereof will be omitted.

Figure 2:
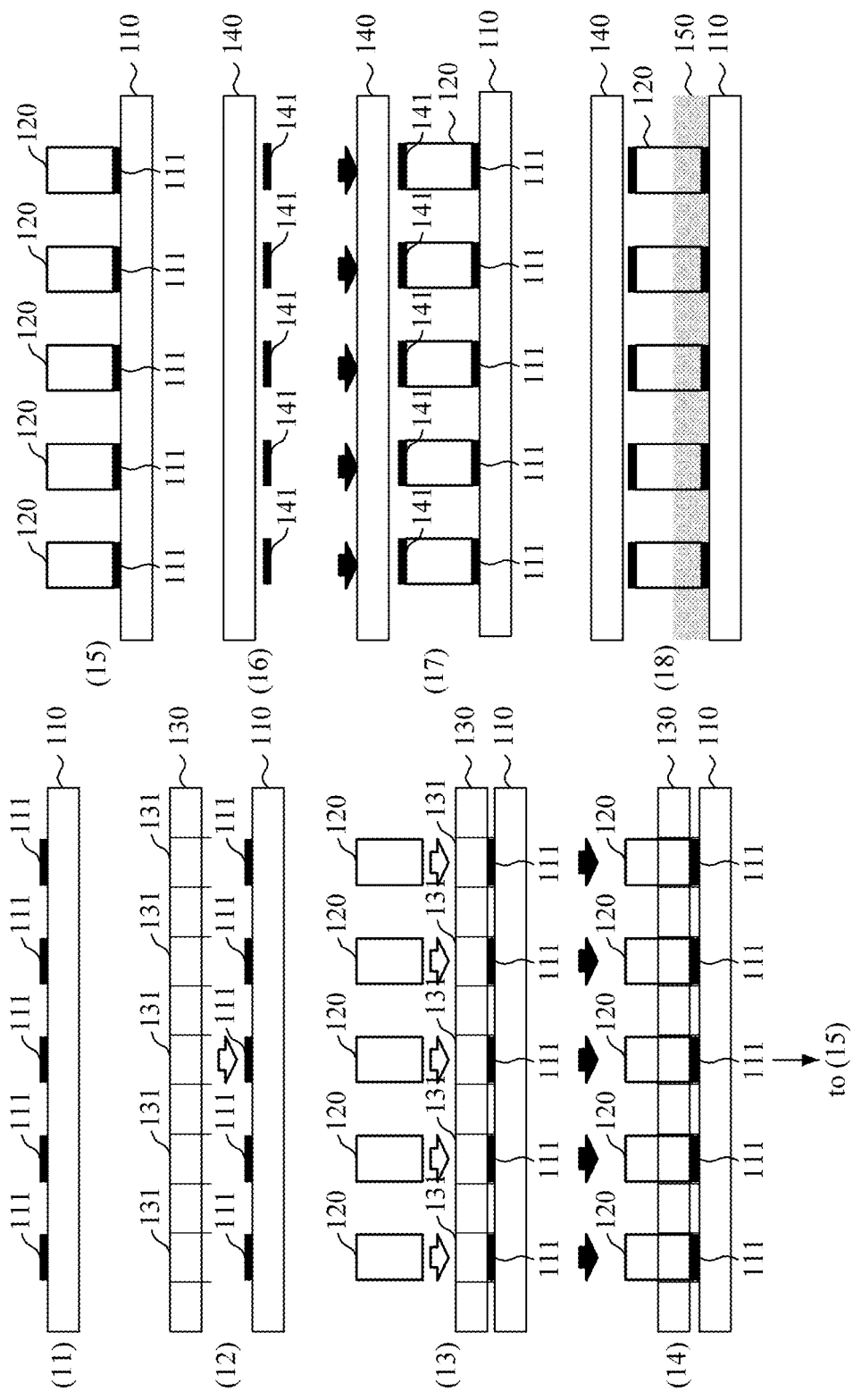
FIG. 2 is a flow chart illustrating a method of fabricating a piezoelectric composite according to another embodiment.

FIG. 2 is a flow chart illustrating a method of fabricating a piezoelectric composite according to another embodiment. Hereinafter, the present disclosure will be described with reference to FIG. 2. In descriptions for FIG. 2, the descriptions overlapping the descriptions in FIG. 1 will be omitted.

According to an additional aspect of the present disclosure, a first conductive adhesive layer forming operation of forming a conductive adhesive layer on one surface of the first electrode plate 110 (see (11)) may be further included before a support member arranging operation (see (12) and (13)).

In the first conductive adhesive layer forming operation (see (11)), a conductive adhesive layer 111 may be formed by, for example, applying the conductive adhesive to the first electrode plate 110. FIG. 3 illustrates a state in which the conductive adhesive layer 111 is applied to one surface of the first electrode plate 110. Further, the conductive adhesive layer 111 may be a conductive epoxy adhesive.

According to an additional aspect of the present disclosure, in the first conductive adhesive layer forming operation (see (11)), a plurality of piezoelectric pillar adhesive regions having shapes corresponding to the through holes 131 of the support member 130 may be formed.

Before the support member arranging operation (see (12) and (13)), the plurality of piezoelectric pillar adhesive regions may be formed on one surface of the first electrode plate 110. The plurality of piezoelectric pillar adhesive regions may have shapes corresponding to the plurality of through holes 131 of the support member 130. As shown in (12) in FIG. 2, piezoelectric pillar adhesive regions may be formed at positions respectively corresponding to the plurality of through holes 131. Further, for example, when the through hole 131 has a cylindrical shape, the piezoelectric pillar adhesive region has a circular shape, and when the through hole 131 has a quadrangular pillar shape, the piezoelectric pillar adhesive region has a quadrangular shape.

As shown in FIG. 2, according to an additional aspect of the present disclosure, a piezoelectric pillar forming operation (see (13) and (14)) may include a piezoelectric pillar inserting operation of inserting the piezoelectric pillars 120 into the through holes 131 of the support member 130 (see (13)), and a piezoelectric pillar lower surface adhering operation of applying a load to the upper surfaces of the plurality of piezoelectric pillars 120 to adhere the lower surfaces of the plurality of piezoelectric pillars 120 to one surface of the first electrode plate 110 (see (14)).

In the piezoelectric pillar inserting operation (see (13) and (14)), the shapes of the piezoelectric pillars 120 correspond to the plurality of through holes 131 formed in the support member 130. The piezoelectric pillars 120 may be inserted through the plurality of through holes 131. In this case, since the shapes of the piezoelectric pillars 120 correspond to the through holes 131 of the support member 130, the support member 130 supports the piezoelectric pillars 120.

In the piezoelectric pillar lower surface adhering operation (see (13) and (14)), the load may be applied to the upper surfaces of the plurality of piezoelectric pillars 120 to adhere the lower surfaces of the plurality of piezoelectric pillars 120 to one surface of the first electrode plate 110. The load is applied to the upper surfaces of the piezoelectric pillars 120 in a state in which the piezoelectric pillars 120 having shapes corresponding to the plurality of through holes 131 are inserted and supported through the plurality of through holes 131. Accordingly, the lower surfaces of the plurality of piezoelectric pillars 120 may be adhered to the plurality of piezoelectric pillars adhesive regions of one surface of the first electrode plate.

In the embodiment, when the plurality of piezoelectric pillars 120 are inserted into the plurality of through holes 131, the lower surfaces of the plurality of piezoelectric pillars 120 and the plurality of piezoelectric pillar adhesive regions of the first electrode plate 110 may come into contact with each other.

According to an additional aspect of the present disclosure, since the plurality of piezoelectric pillars 120 are inserted into the plurality of through holes 131 formed in the support member 130 and respectively arranged in the piezoelectric pillar adhesive regions of the first electrode plate 110 and are adhered, the plurality of piezoelectric pillars 120 may be easily arranged on and adhered to the piezoelectric pillar adhesive regions of the first electrode plate 110.

As shown in FIG. 2, according to an additional aspect of the present disclosure, an operation of removing the support member 130 (see (15)), a second conductive adhesive layer forming operation of forming a conductive adhesive layer 141 on one surface of the second electrode plate 140 (see (16)), and a piezoelectric pillar upper surface adhering operation of adhering the upper surfaces of the plurality of piezoelectric pillars 120 to one surface of the second electrode plate 140 (see (17)) may be further included.

In the embodiment, when the piezoelectric pillars 120 are adhered to one surface of the first electrode plate 110, in the operation of removing the support member 130 (see (15)), the support member 130 which supports the piezoelectric pillars 120 may be lifted upward and removed from the first electrode plate 110.

Further, in the second conductive adhesive layer forming operation (see (16)), the conductive adhesive layer 141 may be formed on one surface of the second electrode plate 140.

In the second conductive adhesive layer forming operation (see (16)), the conductive adhesive layer 141 may be formed by, for example, applying the conductive adhesive to one surface of the second electrode plate 140. Further, the conductive adhesive layer 141 may be a conductive epoxy adhesive.

In addition, in the piezoelectric pillar upper surface adhering operation (see (17)), the upper surfaces of the plurality of piezoelectric pillars 120 are adhered to one surface of the second electrode plate 140 formed with the conductive adhesive layer 141.

According to an additional aspect of the present disclosure, since the plurality of piezoelectric pillars 120 are formed to be adhered between one surface of the first electrode plate 110 and one surface of the second electrode plate 140, the piezoelectric composite may be easily implemented at low cost.

As shown in FIG. 2, according to an additional aspect of the present disclosure, in the second conductive adhesive layer forming operation (see (16)), a plurality of piezoelectric pillar adhesive regions 141 having shapes corresponding to the through holes 131 of the support member 130 may be formed on one surface of the second electrode plate 140.

The plurality of piezoelectric pillar adhesive regions 141 formed on one surface of the second electrode plate 140 may have shapes corresponding to the plurality of through holes 131 of the support member 130. As shown in (17) in FIG. 2, the piezoelectric pillar adhesive regions 141 may be formed at positions respectively corresponding to the plurality of through holes 131. Further, for example, when the through hole 131 has a cylindrical shape, the piezoelectric pillar adhesive region 141 has a circular shape, and when the through hole 131 has a quadrangular pillar shape, the piezoelectric pillar adhesive region 141 has a quadrangular shape.

As shown in FIG. 2, according to an additional aspect of the present disclosure, the piezoelectric pillar upper surface adhering operation (see (17)) may include an operation of applying a load to the other surface of the second electrode plate 140 to adhere the upper surfaces of the plurality of piezoelectric pillars 120 to one surface of the second electrode plate 140.

As shown in FIG. 2, according to an additional aspect, a polymer filling operation of filling the periphery of the plurality of piezoelectric pillars 120 with a polymer 150 (see (18)) may be further included.

According to the embodiment, the space except for the piezoelectric pillars 120 among the space between the first electrode plate 110 and the second electrode plate 140 may be filled with an air layer, or at least a portion of the remaining space may be filled with the polymer 150. The polymer 150 may be polyepoxy or a polyurethane-based polymer compound. Further, the polymer 150 may be a thermosetting epoxy having a predetermined density.

Since the technique itself for filling the space between the first electrode plate 110 and the second electrode plate 140 with the polymer having low acoustic impedance is well known to those skilled in the art, a detailed description thereof will be omitted.

As shown in FIG. 2, according to an additional aspect of the present disclosure, the piezoelectric pillar lower surface adhering operation (see (14)) and piezoelectric pillar upper surface adhering operation (see (17)), may include an operation of heating the plurality of piezoelectric pillars 120 for 30 to 90 minutes at a temperature of 130° C. to 160° C.

That is, when the lower surfaces and the upper surfaces of the plurality of piezoelectric pillars are respectively adhered to one surface of first electrode plate and one surface of the second electrode plate, the load may be applied to the upper surfaces of the plurality of piezoelectric pillars, and the plurality of piezoelectric pillars may be additionally heated for 30 to 90 minutes at the temperature of 130° C. to 160° C.

Accordingly, the plurality of piezoelectric pillars may be adhered to the electrode plates using a temperature (130° C. to 160° C.) much lower than temperatures used in a conventional powder injection-molding fabrication method (for example, a temperature in the degreasing operation (600° C.), and a temperature in the sintering operation (1250° C. to 1320° C.)).

The adhesive used in this case is an epoxy-based thermosetting resin and serves to bond and electrically connect the piezoelectric pillars and the metal plate. When the epoxy resin is heat-treated at the temperature of 130° C. to 160° C. for 30 minutes or more, since the epoxy resin is hardened, the piezoelectric pillars may be fixed to the metal plate. When the heat treatment temperature is lower than 130° C., the epoxy is not sufficiently hardened and thus hardness is reduced, and a bonded portion may be separated due to a vibration of the piezoelectric ceramic while a transducer is driven. When the heat treatment temperature is higher than 160° C., a bonding force between the epoxy and the piezoelectric ceramic is lowered, and when the temperature rises to 200° C. or more, the piezoelectric ceramic may be separated from the metal plate. Like the above, in the method of separately fabricating the piezoelectric pillars and bonding the piezoelectric pillars to the metal plate, there is an effect that a process can be simplified compared to a conventional 1-3 composite fabrication method (piezoelectric ceramic fabrication→upper surface dicing→upper surface polymer filling→upper surface cutting→lower surface dicing→lower surface polymer filling→lower surface cutting).

As shown in FIGS. 1 and 2, according to an additional aspect of the present disclosure, the first conductive adhesive layer forming operation (see (11)) or the second conductive adhesive layer forming operation (see (16)) may include an operation of screen-printing a conductive adhesive on the plurality of piezoelectric pillar adhesive regions 111 and 141 having shapes corresponding to the through holes 131 of the support member 130.

The conductive adhesive may be screen-printed only on the plurality of piezoelectric pillar adhesive regions 111 by covering the remaining region of one surface of the first electrode plate 110, and the conductive adhesive may be screen-printed only on the plurality of piezoelectric pillar adhesive regions 141 by covering the remaining region of one surface of the second electrode plate 140. Accordingly, it is possible to easily form the conductive adhesive only on the plurality of piezoelectric pillar adhesive regions 111 and 141. In the embodiment, the conductive adhesive to be screen printed may be an epoxy conductive adhesive.

Figure 5:
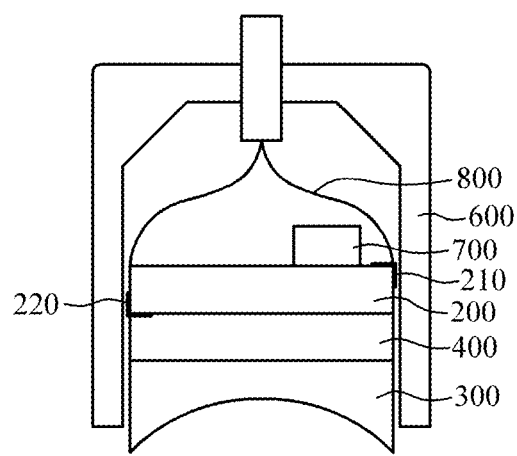
FIG. 5 is a cross-sectional view illustrating an ultrasonic transducer according to one embodiment.

FIG. 5 is a cross-sectional view illustrating an ultrasonic transducer according to one embodiment.

As shown in FIG. 5, the ultrasonic transducer may include a piezoelectric composite 200 which generates an ultrasonic vibration when a voltage is applied, a spherical lens 300 which focuses the ultrasonic vibration generated from the piezoelectric composite 200, and an acoustic impedance matching layer 400 formed between the piezoelectric composite 200 and the spherical lenses 300 to match acoustic impedance.

In the embodiment, the piezoelectric composite 200 is the piezoelectric composite 200 fabricated by the method in FIG. 1 or FIG. 2. A first line connection part 210 may be provided on a lower surface corresponding to the first electrode plate 110 of the piezoelectric composite 200 and a second line connection part 220 may be provided on an upper surface corresponding to the second electrode plate 140 of the piezoelectric composite 200. When a voltage is applied from a voltage application line 800, the piezoelectric composite 200 generates the ultrasonic vibration. The spherical lens 300 may focus the ultrasonic vibration generated from the piezoelectric composite 200. The spherical lens 300 may be a concave lens. The acoustic impedance matching layer 400 may be formed between the piezoelectric composite 200 and the spherical lens 300 to match the acoustic impedance.

A heat pipe 700 provided on an upper surface of the piezoelectric composite 200 may serve to dissipate heat generated from the piezoelectric composite 200 to the outside. The reference numeral 600 denotes a housing 600 of the ultrasonic transducer.

According to the present disclosure, fabrication costs of a piezoelectric composite can be reduced.

Further, according to the present disclosure, a piezoelectric composite can be easily and simply fabricated using a simple method instead of a conventional powder injection-molding fabrication method.

In addition, according to the present disclosure, a piezoelectric composite can be fabricated at a relatively low temperature without an injection-molded body of the piezoelectric composite.

In the above description, the present disclosure is described through the embodiment with reference to the accompanying drawings, but is not limited thereto, and the present disclosure should be interpreted as encompassing various modified examples which may be clearly derived by those skilled in the art. The claims are intended to encompass such modified examples.

What is claimed is:
1. A method of fabricating a piezoelectric composite, the method comprising:
    an electrode plate preparing operation of preparing a first electrode plate;
    a support member arranging operation of locating a support member formed with a plurality of through holes on one surface of the first electrode plate; and
    a piezoelectric pillar inserting operation of inserting a plurality of piezoelectric pillars having shapes respectively corresponding to the through holes and being previously generated by sintering piezoelectric pellets into the through holes;
    a piezoelectric pillar lower surface adhering operation of adhering lower surfaces of the plurality of piezoelectric pillars respectively to the one surface of the first electrode plate by applying a load to upper surfaces of the plurality of piezoelectric pillars respectively;
    a support member removing operation of removing the support member;
    a piezoelectric pillar upper surface adhering operation of adhering the upper surfaces of the plurality of piezoelectric pillars respectively to one surface of a second electrode plate by applying a load to the other surface of the second electrode plate;
    a polymer filling operation of filling the periphery of the plurality of piezoelectric pillars with a polymer;
    wherein the piezoelectric pillar lower surface adhering operation and the piezoelectric pillar upper surface adhering operation further include an operation of heating for 30 to 90 minutes at a temperature of 100° C. to 130° C.

2. The method of claim 1, further comprising, before the support member arranging operation, a first conductive adhesive layer forming operation of forming a conductive adhesive layer on the one surface of the first electrode plate.

3. The method of claim 2, wherein, in the first conductive adhesive layer forming operation, a plurality of piezoelectric pillar adhesive regions having shapes corresponding to the through holes of the support member are formed.

4. The method of claim 3, further comprising:
a second conductive adhesive layer forming operation of forming a conductive adhesive layer on one surface of a second electrode plate.

5. The method of claim 4, wherein, in the second conductive adhesive layer forming operation, a plurality of piezoelectric pillar adhesive regions having shapes corresponding to the through holes of the support member are formed.

6. The method of claim 5, wherein the first conductive adhesive layer forming operation and the second conductive adhesive layer forming operation includes an operation of screen-printing a conductive adhesive on the plurality of piezoelectric pillar adhesive regions having shapes corresponding to the through holes of the support member.

* * * * *